(12) United States Patent
Zoestbergen et al.

(10) Patent No.: US 11,414,744 B2
(45) Date of Patent: Aug. 16, 2022

(54) METHOD TO OPERATE AN APPARATUS FOR FEEDING LIQUID METAL TO AN EVAPORATOR DEVICE

(71) Applicant: TATA STEEL NEDERLAND TECHNOLOGY B.V., Velsen-Noord (NL)

(72) Inventors: Edzo Zoestbergen, Alkmaar (NL); Colin Commandeur, Beverwijk (NL); Roland Jan Snijders, Wijk aan Zee (NL); Eduard Paul Mattheus Bakker, Sint Paneras (NL); Peter William Hazelett, Winooski, VT (US); Douglas Alexander Hamilton, Shelburne, VT (US); Stephen James Widdis, Colchester, VT (US); Timothy Dean Kaiser, Colchester, VT (US)

(73) Assignee: TATA STEEL NEDERLAND TECHNOLOGY B.V., Velsen-Noord (NL)

( * ) Notice: Subject to any disclaimer, the term of this patent is extended or adjusted under 35 U.S.C. 154(b) by 762 days.

(21) Appl. No.: 16/098,461

(22) PCT Filed: May 1, 2017

(86) PCT No.: PCT/EP2017/060317
§ 371 (c)(1),
(2) Date: Nov. 2, 2018

(87) PCT Pub. No.: WO2017/191083
PCT Pub. Date: Nov. 9, 2017

(65) Prior Publication Data
US 2019/0264320 A1    Aug. 29, 2019

(30) Foreign Application Priority Data
May 3, 2016 (EP) .................................. 16168162

(51) Int. Cl.
| | |
|---|---|
| *C23C 14/24* | (2006.01) |
| *C23C 14/14* | (2006.01) |
| *H02K 44/02* | (2006.01) |
| *H02K 44/04* | (2006.01) |
| *C23C 14/16* | (2006.01) |
| *C23C 14/56* | (2006.01) |

(52) U.S. Cl.
CPC ............ *C23C 14/246* (2013.01); *C23C 14/14* (2013.01); *C23C 14/16* (2013.01); *H02K 44/02* (2013.01); *H02K 44/04* (2013.01); *C23C 14/56* (2013.01)

(58) Field of Classification Search
CPC ....... C23C 14/246; C23C 14/16; C23C 14/14; C23C 14/56; H02K 44/04; H02K 44/02
See application file for complete search history.

(56) References Cited

U.S. PATENT DOCUMENTS

| | | |
|---|---|---|
| 2,664,852 A | 1/1954 | Chadsey |
| 3,059,612 A | 10/1962 | Baughman et al. |

(Continued)

FOREIGN PATENT DOCUMENTS

| | | |
|---|---|---|
| CN | 204805055 U | 11/2015 |
| EP | 2831305 | 2/2015 |

(Continued)

OTHER PUBLICATIONS

International Search Report and Written Opinion dated Jun. 9, 2017 for PCT/EP2017/060317 to Tata Steel Nederland B.V. filed May 1, 2017.

*Primary Examiner* — Michael B Cleveland
*Assistant Examiner* — Michael G Miller
(74) *Attorney, Agent, or Firm* — Vorys, Sater, Seymour and Pease LLP

(57) ABSTRACT

A method to operate an apparatus for feeding liquid metal to an evaporator device in a vacuum chamber, wherein the feed tube runs from a container adapted to contain a liquid metal to the evaporator device and wherein an electromagnetic (Continued)

pump is provided in the feed tube and a valve in the feed tube between the electromagnetic pump and the evaporator device. An at least partially gas permeable electromagnetic pump, which is enclosed in a pressure controlled enclosure, is used in the method wherein electromagnetic pump and the pressure controlled enclosure are controlled such that filling and draining of the evaporator device and feed tube can be done without affecting the vacuum pressure in the vacuum chamber.

17 Claims, 2 Drawing Sheets

(56) References Cited

U.S. PATENT DOCUMENTS

| | | |
|---|---|---|
| 3,408,224 A | 10/1968 | Ashburn et al. |
| 3,581,766 A | 6/1971 | Gimigliano et al. |
| 4,392,786 A | 7/1983 | Merenkov et al. |
| 2005/0072361 A1 | 4/2005 | Yang et al. |
| 2007/0218201 A1* | 9/2007 | Gottsman ............... C23C 14/56 427/248.1 |
| 2010/0263454 A1* | 10/2010 | Araseki ................. G01F 1/582 73/861.11 |
| 2019/0153587 A1 | 5/2019 | Zoestbergen et al. |

FOREIGN PATENT DOCUMENTS

| | | | |
|---|---|---|---|
| GB | 1220020 A | 1/1971 | |
| JP | S59038379 A | 3/1984 | |
| KR | 20070011542 A | 1/2007 | |
| KR | 20110034420 A | 4/2011 | |
| WO | 2012081738 A1 | 6/2012 | |
| WO | 2013143692 A1 | 10/2013 | |
| WO | WO-2013143692 A1 * | 10/2013 | ........... C23C 14/246 |
| WO | 2015067662 A1 | 5/2015 | |
| WO | 2017191081 A1 | 11/2017 | |
| WO | 2017191082 A1 | 11/2017 | |

* cited by examiner

METHOD TO OPERATE AN APPARATUS FOR FEEDING LIQUID METAL TO AN EVAPORATOR DEVICE

CROSS-REFERENCE TO RELATED APPLICATIONS

This is a § 371 National Stage Application of International Application No. PCT/EP2017/060317 filed on May 1, 2017, claiming the priority of European Patent Application No. 16168162.2 filed on May 3, 2016.

FIELD OF THE INVENTION

The invention relates to a method to operate an apparatus for feeding liquid metal to an evaporator device in a vacuum chamber. Such a device is for instance used in depositing of a metal coating on a substrate by means of physical vapour deposition (PVD).

BACKGROUND OF THE INVENTION

For continuous or semi-continuous PVD coating processes on an industrial scale a vacuum coating set-up is required that is able to process large amounts of coating material over time. Furthermore, when thermal evaporation is used the temperature of the liquid in the evaporator device has to be much higher than the melting point of the material to be evaporated. Hence, it is desirable and cost effective to have a small evaporator device and to supply material into the evaporator device to meet the demand. Feeding can be done with either solid or liquid material. However, the best way is to feed with liquid metal from a large liquid reservoir which has the advantage that the oxide content in the evaporator is minimised and that the latent heat of melting and the specific heat of the material do not have to be supplied at the evaporator device.

The PVD coating device disclosed in U.S. Pat. No. 2,664,852 has a reservoir for liquid metal in the vacuum chamber. With this set-up the maximum campaign length is quite limited. In more recent PVD coating devices the liquid metal reservoir is places outside the vacuum chamber, see for instance WO2012081738. However, due to the pressure difference between the vacuum at the evaporator device and the liquid metal reservoir a force is executed on the liquid metal in the reservoir which needs to be controlled. This force will change when the liquid level in the reservoir drops, the vacuum pressure at the evaporator device changes or the level in the evaporator device changes and needs to be controlled to keep a constant supply to the evaporator device to ensure a constant evaporation.

The supply of liquid metal from the liquid metal container to the evaporator device can be controlled in different ways. In U.S. Pat. No. 3,059,612 it is disclosed to lift the container with liquid metal in order to keep the height difference between the liquid metal surface in the evaporator device and the level in the liquid metal container constant. However, a change in barometric pressure will already give rise to a different level in the evaporator device and as a result a change in evaporation.

In U.S. Pat. No. 3,581,766 an additional reservoir is provided between the main liquid metal container and the evaporator device. In this intermediate reservoir the level is kept constant by means of an overflow drain through which the liquid flows out of the intermediate reservoir back to the main liquid metal container. However, the issue with a varying barometric pressure still exist and the question how to start or stop the system without breaking the vacuum might prove difficult. Hence, first off-all a valve is required between the liquid metal container and the evaporator device, see for example WO2012081738. It is tried to use such a valve to control the flow but this is impractical and it is not possible to empty the evaporator device at the end of an experiment without breaking the vacuum. A better solution is disclosed in WO2013143692 where both a valve and a pump are used to control the flow.

However, there are still other issues that are not covered in the aforementioned publications. One of the issues with the reservoir being located outside the vacuum chamber is related to the fact that the feed tube has to pass through the wall of the vacuum chamber. The feed through for the feed tube must be able to accommodate the expansion difference that occur during heating of the whole set-up but should be such that the vacuum conditions in the chamber are not affected. This can be done with a bellow type of connection, see for instance GB1220020, but it is just as important that this set-up does not generate a cold spot which might result in freezing of the melt and as such a blockage.

Another requirement is that all the tubing and the electromagnetic pump should be heated to the required temperature and maintained at that temperature during operation. More in particular the heating of the electromagnetic pump requires special attention because due to the construction of the electromagnetic pump cold spots in the pump may easily occur.

Another issue with the reservoir being located on the outside is possible contamination of the feeding system with oxides from the liquid container which might be introduced in the evaporator or the tubing and generate issues with the evaporation or blockage. In patent JPS5938379 a start up procedure is described that uses a reducing gas to remove the oxides. However this will not work for all kinds of liquids and the vacuum is changed during this process. Jet another requirement is that all the tubing should be heated to the required temperature and furthermore as stated in patent U.S. Pat. No. 3,408,224 it might be necessary to degas the liquid material prior to the deposition to assure that this degassing is not occurring in the evaporator which might disturb the evaporation process.

Finally the method disclosed in WO2015067662 makes it possible to drain the evaporator without braking the vacuum but it is without additional measures not possible to empty all the tubing in the system.

OBJECTIVES OF THE INVENTION

It is an objective of the present invention to provide a method to operate an apparatus for feeding liquid metal to an evaporator device in a vacuum chamber without that the vacuum in the vacuum chamber is affected during operation.

It is another objective of the present invention to provide a method to operate an apparatus for feeding liquid metal to an evaporator device in a vacuum chamber without that the vacuum in the vacuum chamber is affected during the filling of the evaporator device.

It is another objective of the present invention to provide a method to operate an apparatus for feeding liquid metal to an evaporator device in a vacuum chamber without that the vacuum in the vacuum chamber is affected during the draining of the evaporator device and the feeding tube connected to the evaporator device.

It is still another objective of the present invention to provide a method to operate an apparatus for feeding liquid metal to an evaporator device in a vacuum chamber without that the vacuum in the vacuum chamber is affected that can be operated in a straightforward manner.

DESCRIPTION OF THE INVENTION

According to a first aspect of the invention one or more of the objectives of the invention are realized by providing a method to operate an apparatus for feeding liquid metal to an evaporator device in a vacuum chamber, wherein the feed tube runs from a container adapted to contain a liquid metal to the evaporator device and wherein an electromagnetic pump is provided in the feed tube and a valve in the feed tube between the electromagnetic pump and the evaporator device, characterised in that the method comprises:

providing an electromagnetic pump which is at least partially gas permeable,
enclosing the electromagnetic pump in a pressure controlled enclosure,
lowering the pressure and/or maintaining a vacuum in the pressure controlled enclosure before and/or when filling the electromagnetic pump with liquid metal,
maintaining a vacuum in the pressure controlled enclosure during operation, and
increasing the pressure and/or maintaining an increased pressure in the pressure controlled enclosure before and/or when draining liquid metal from the electromagnetic pump.

With the feeding of a liquid metal from a container outside a vacuum chamber through a feed tube to an evaporator device it is very likely that the vacuum in the vacuum chamber will be affected. In particular this is most likely at the start and the end of an evaporation process, such as a PVD process. At the start of the process a valve in the feed tube will prevent that there is a direct connection between the vacuum chamber and the outside environment. However, when liquid metal is fed from the container through the feed tube to the evaporator device, the valve in the feed tube has to be opened and the air or gas still present in the feed tube downstream of the valve will be drawn into the vacuum chamber. With air or gas coming into the vacuum chamber the vacuum pressure in the vacuum chamber will be affected and has to be lowered again to a predetermined vacuum pressure which will cost time and energy. Another problem is that with the outside air contaminations may enter the vacuum chamber.

The method according the invention has the advantage that by using a gas permeable electromagnetic pump the feed tube can be filled with liquid metal, while driving out the majority of air or gas present in the feed tube, before the valve is opened.

In a reversed order the evaporator device can be emptied in a first step till the liquid metal is below the valve in the feed tube, after which the valve is closed and the feed tube can be emptied completely by having air or gas entering the feed tube through the gas permeable electromagnetic pump.

A prerequisite for the use of a gas permeable electromagnetic pump as described is to have the gas permeable electromagnetic pump enclosed in a pressure controlled enclosure. Without such an enclosure air would be drawn into the feed tube through the gas permeable electromagnetic pump during normal operation and the vacuum of the vacuum chamber would still be compromised.

The pressure in the pressure controlled enclosure varies in a pressure range from 1-1000 mbar or about atmospheric pressure. With the filling of the feed tube and during normal operation the pressure in the pressure controlled enclosure is preferably kept in the range of 1-200 mbar. With the pressure in this range in the pressure controlled enclosure no air or other gas will be drawn via the feed system into the vacuum chamber.

With the emptying of the evaporator device and the feed tube, the pressure in the pressure controlled enclosure is increased to atmospheric pressure or higher in order to let air or other gas enter the feed tube through the gas permeable electromagnetic pump. The pressure in the pressure controlled enclosure is increased after the level of the liquid metal is below the valve in the feed tube. Below the valve in the feed tube is directly below the valve or at a level in the electromagnetic pump, which might be the level at which the electromagnetic pump can still exert a Lorentz force on the liquid metal.

According to a further aspect of the invention it is provided that the pressure controlled enclosure also encloses at least part of the feed tube. This feature provides the advantage of a reduced heat loss because heat losses through convection are reduced to a great extent in a vacuum. Another advantage is that by providing that the enclosed part of the feed tube that is located above the electromagnetic pump is at least partially gas permeable, the feed tube can be used in removing air or other gas from the feed tube with the filling of the feed tube and letting air into the feed tube with the draining of the feed tube. This applies specially for the part of the feed tube between the gas permeable electromagnetic pump and the valve in the feed tube.

According to a further aspect of the invention it is provided that the electromagnetic pump is at least partially made of graphite. It was found that graphite has a certain permeability for gasses like for instance N2 and air. For liquid metal, such as Zn or Mg or a mixture of liquid metals the graphite pump is impermeable. The gas permeability of graphite is controlled by controlling the pressure in the pressure controlled enclosure as described above.

According to a further aspect of the invention it is provided that the enclosed part of the feed tube is at least partially made of graphite. This has the same effect as described for the gas permeable electromagnetic pump.

It is further provided that the force exerted on the liquid metal in the container adapted to contain a liquid metal is controlled.

Preferably, the container adapted to contain a liquid metal is a closed container and wherein the force exerted on the liquid metal is controlled by controlling the pressure of the gas in the closed container. In this way the force to be exerted on the liquid metal in the container can be controlled very easily and can be varied rapidly if need be. The term "closed container" will mean a container wherein the pressure and/or the composition of the gas inside the container is or can be controlled.

According to a further aspect of the invention the method includes that a return tube is provided, which runs from the evaporator device to the container, an electromagnetic pump, which is at least partially gas permeable, in the return tube and a valve in the return tube between the electromagnetic pump and the vacuum chamber is provided, wherein the electromagnetic pump in the return tube is provided in the pressure controlled enclosure, comprising the step of increasing the pressure and/or maintaining an increased pressure in the pressure controlled enclosure before and/or when draining liquid metal from the electromagnetic pump.

With a feed tube and a return tube the composition of the liquid metal in the evaporator device can be controlled. Control of the composition means that the composition remains constant as much as possible and is not changed because of different evaporation rates of constituents.

The invention also includes an electromagnetic pump for use in the method wherein the electromagnetic pump is at least partially made of a gas permeable material. Preferably, the gas permeable material is graphite.

The invention provides an apparatus for feeding liquid metal to an evaporator device in a vacuum chamber, the apparatus further comprising a container adapted to contain a liquid metal, a feed tube from the container to the evaporator device and an electromagnetic pump provided in the feed tube, wherein the electromagnetic pump is at least partially a gas permeable electromagnetic pump and wherein a pressure controlled enclosure is provided which encloses the electromagnetic pump.

According to a further aspect of the invention the pressure controlled enclosure encloses at least part of the feed tube.

The gas permeable electromagnetic pump is at least partially made of graphite. Preferably also at least part of the feed tube that is enclosed in the pressure controlled enclosure is made of graphite.

BRIEF DESCRIPTION OF THE DRAWINGS

The invention will be further explained by the example shown in the drawing, in which.

DETAILED DESCRIPTION OF THE DRAWINGS

Figure 1:
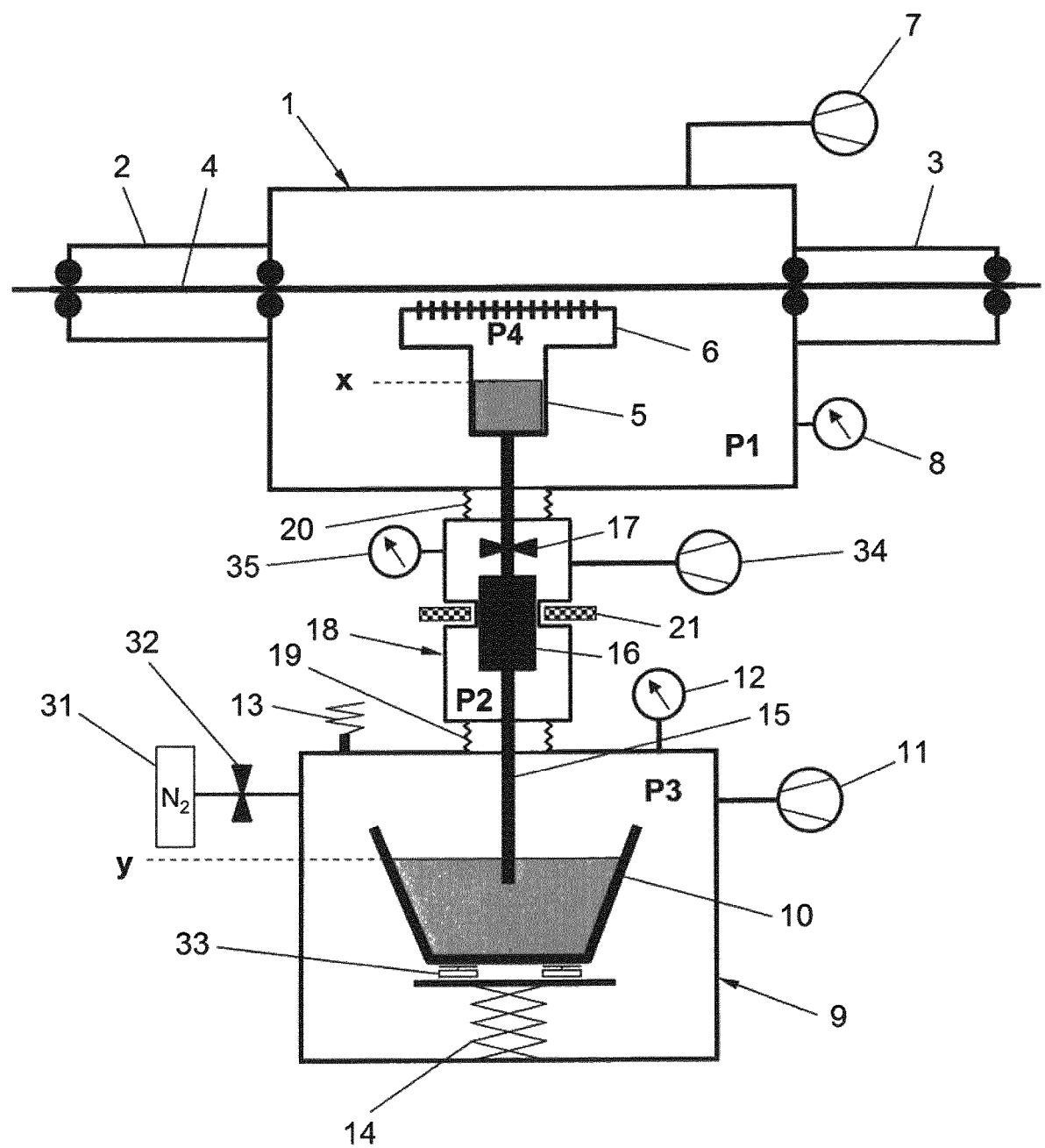
FIG. 1 shows a schematic view of an apparatus with a container for a liquid metal, an electromagnetic pump in a vacuum enclosure and a vacuum chamber.

FIG. 1 shows a schematic view of an apparatus with a vacuum chamber 1, on both sides provided with vacuum locks 2,3, through which a strip 4 is guided. An evaporator device 5 is positioned inside the vacuum chamber 1 and connected to a vapour distributor 6. The means to supply sufficient energy to the evaporator device, such as in induction coil, are also placed inside the vacuum chamber. For the sake of clarity these means are not shown in the drawing. The vacuum chamber is further provided with vacuum pump 7 and manometer 8.

At the bottom of FIG. 1 a closed container 9 is provided with inside the container a vessel 10 to hold a liquid metal. The closed container 9 is further provided with a pump 11, manometer 12 and overpressure relay 13. The vessel is provided with heating means (not shown) to heat and melt the metal and/or to keep the liquid metal at a certain temperature. A gas supply 31 with a valve 32 is connected to closed container 9 to replace the air initially present in container 9 with a non-oxidising gas, for instance Nitrogen. Lifting means 14 are provided to lift and lower vessel 10 to be able to immerse the end of feed tube 15 into the liquid metal or lift it out of the liquid metal. The lifting means 14 can also be used in the control of the flow rate of the liquid metal to the evaporator device 5, since with the lifting and lowering the distance between the liquid level in the vessel and that in the evaporation device changes.

The vessel 10 is placed on weighing devices 35 which allows to continuously weigh the content of vessel 10 which provides extra information on the flow rate of the liquid metal and the evaporation rate.

The pump 11 is used to lower the pressure in the closed container. In order to prevent oxidation of the liquid metal in the vessel the air in the closed container can be removed and replaced completely or partially with an inert gas. With this operation the air is first partially removed therewith lowering the pressure before being replaced by an inert gas after which the pressure in the closed container is adjusted and controlled in order to control the flow rate of the liquid metal to the evaporator device.

The feed tube 15 runs from the vessel 10 inside the closed container 9 in upward direction to the evaporator device 5 and in the feed tube a gas permeable electromagnetic pump 16 and a valve 17 are provided. The gas permeable electromagnetic pump 16 and valve 17 are placed inside a pressure controlled enclosure 18. The pressure controlled enclosure 18 is kept at a low vacuum during operation which prevent heat losses through convection from the electromagnetic pump 16 as well as from the feed tube 15 to a great degree. To that end the vacuum enclosure 18 is provided with a vacuum pump 34 and a manometer 35.

At the start of a PVD process the evaporator device 5 is provided with liquid metal from the vessel 10 through feed tube 15. At this stage valve 17 is closed. It is important that all components are thoroughly heated before the filling procedure commences. The pressure inside the pressure controlled enclosure 18 is lowered or already lowered to a pressure in the range of 1-200 mbar. Because of the permeability of the gas permeable electromagnetic pump the air or gas present in the feed tube 15 is driven out of through the gas permeable electromagnetic pump. This process can be speeded up or assisted by increasing the pressure inside the closed container 9 to forced the liquid metal into feed tube 15. With also the feed tube being gas permeable up to at least valve 17 all or as good as all of the air or gas in the feed tube 15 can be driven out before valve 17 is opened. In this way it is prevented that the vacuum pressure in the vacuum chamber is affected.

The part of feed tube 15 below the pressure controlled enclosure 18, that is the part of the feed tube in bellow 19 and inside closed container 9, should be gas impermeable.

At the end of a PVD process the liquid metal is drawn from the evaporator device 5 and returned to vessel 10 in container 9. To this end, the gas permeable electromagnetic pump 16 is controlled to force the liquid metal to vessel 10. As soon as the liquid metal is at a level below valve 17, valve 17 is closed and the vacuum chamber is no longer in connection with the system below valve 17. The pressure inside the pressure controlled enclosure 18 is raised and with the increased pressure the air or gas in the pressure controlled enclosure will easily be drawn into the feed tube through the gas permeable electromagnetic pump and the gas permeable feed tube as far as provided. With that the liquid metal can be drawn from the feed tube in a controlled manner without causing any splashes or disturbances in the liquid metal in vessel 10. This process can be speeded up or assisted by decreasing the pressure inside the closed container 9 to force the liquid metal into the liquid container. However care should be taken that no evaporation will occur and as such contamination of the closed container.

The pressure controlled enclosure 18 connects to the closed container 9 and the vacuum chamber 1 by means of bellows 19, 20. The connection by means of the bellows 19, 20 is to the outside of the closed container 9 and the vacuum chamber 1 and does not connect the internal spaces of container 9 and vacuum chamber 1. However, the unavoidable vacuum leak at the feed through of the feed tube 15 into the vacuum chamber 1 is much less because of the low vacuum in the pressure controlled enclosure 18.

The electromagnetic pump 16 pump is provided with a permanent magnet 21 to generate a magnetic field and a power supply to pass a current through the liquid metal in the electromagnetic pump. The Lorentz force resulting from the magnetic field and the current will exert a force on the liquid metal which is used in the control of the flow rate of the liquid metal. The Lorentz force only works as long as the liquid metal is in contact with the electrodes 22 of the electromagnetic pump and within the magnetic field of permanent magnet 21. As a result when the liquid metal is forced downwards the liquid metal level can not be lower than a level at about the height of the electrodes.

It is important that the magnet 21 is not overheated because this will result in a decrease of the strength of the magnetic field. For that reason the magnet 21 is placed outside the pressure controlled enclosure 18, which at least at the location of the magnet and its magnetic field is made of a non-ferromagnetic material.

The upward force on the liquid metal is given by the pressure difference and the column height:
P3−P1−(X−Y)*density liquid, wherein
P3=the pressure in the closed container,
P1=the pressure in the vacuum chamber,
X=height top level of the liquid metal, which can be in the evaporator device or somewhere in the feed tube, and
Y=height level of the liquid metal in the vessel in the closed container.

Once the evaporation of the liquid metal in the evaporator device has started the driving force for the liquid metal is:
P3−P4−(X−Y)*density liquid, wherein
P4 is the pressure in the vapour distributor 6 which will be higher than the pressure in the vacuum chamber.

Figures 2A, 2B:
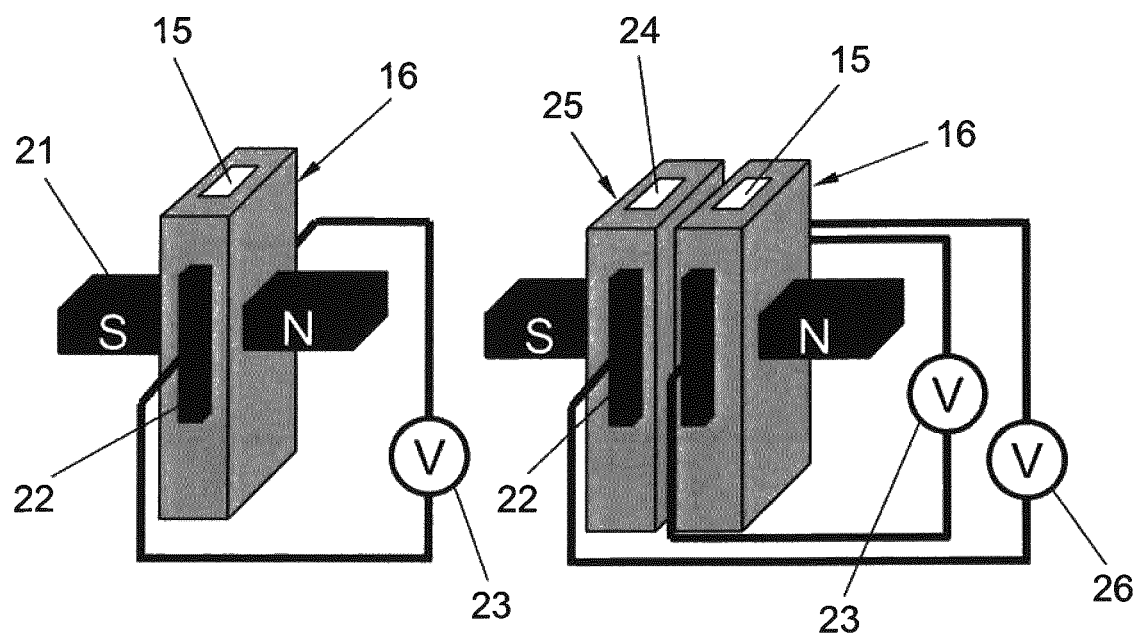
FIGS. 2A,2B,2C shows a schematic view of respectively an electromagnetic pump for a feed tube and an electromagnetic pump for a feed tube and return tube.

When the electromagnetic pump is exerting a force against the upward flow of the liquid metal the force is given by:
P3−P1−(X−Y)*density liquid−B*I*C, wherein:
B is magnetic field, I the current through the liquid metal and C a constant. Once the evaporation has started the equation changes to:
P3−P4−(X−Y)*density liquid−B*I*C FIG. 2A shows a schematic view of an electromagnetic pump 16 for a feed tube 15 with the electrodes 22 on opposite sides against the body of the electromagnetic pump 16. The electrodes 22 are connected to a power supply 23, in this case a variable DC power supply. In this configuration the electrodes are not in direct contact with the liquid metal which has the advantage that the electrodes will last far longer than electrodes that are in direct contact with the liquid metal. A prerequisite is that the material of the gas permeable electromagnetic pump is electrically conductive, which is the case with an electromagnetic pump of graphite. An additional advantage is that the current passes through the body of the electromagnetic pump as a result of which the electromagnetic pump can be heated through resistance heating. The method as described works of course also with gas permeable electromagnetic pumps wherein the electrodes are in direct contact with the liquid metal.

Perpendicular to the electrodes 22 are the poles of magnet 21, which in this configuration are two permanent magnets connected by means of a yoke (not shown). Instead of permanent magnets it is also possible to use an electromagnet, for instance an electromagnet with a DC coil. By varying the current through the coil the magnetic field could be varied.

Instead of a variable DC power supply and a DC coil it is as well possible to use a variable AC power supply and an AC coil for the electromagnet.

FIG. 2B shows a configuration with a feed tube 15 and a return tube 24 next to each other with electromagnetic pumps 18, 25 for respectively the feed tube 15 and return tube 24. The magnetic field for both the feed tube 15 and the return tube 24 is provided with the same permanent magnets 21. Separate variable DC power supplies 23, 26 are provided for respectively the feed tube 15 and the return tube 24 which are reversely connected to the electrodes since the Lorentz forces should be in opposite direction. The feed tube 15 and the return tube 24 are in thermal contact with each other but electrically isolated from each other. The flow rate in the return tube will differ by the evaporation rate from the flow rate in the feed tube and for that reason the current through the return tube 24 will be larger than through the feed tube 15.

Figure 2C:
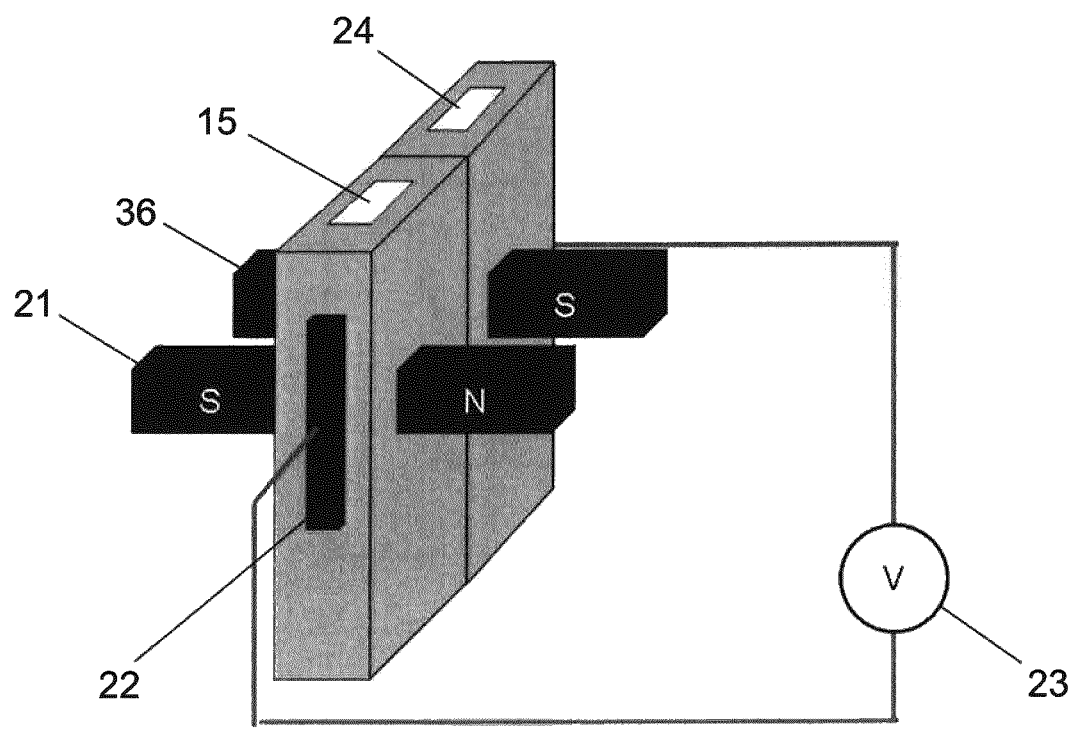

FIG. 2C shows a configuration wherein the electrodes 22 of feed tube 15 and feed tube 25 are connected in series which only requires one power supply 23 and wherein the same current passes through both feed tubes. In order to control the flow rate in each tube the magnetic field of the magnet 21, 36 in each tube 15, 24 is controlled separately.

With a feed tube 15 and a return tube 24 the filling of the feed tube 15 is the same as for the configuration with only a feed tube. Preferably, however, the return tube 24 is filled in the same manner as the feed tube in order to prevent that air or gas in the return tube up to a valve in the return tube, which valve is provided between the gas permeable electromagnetic pump 25 and the evaporator device 5, is drawn into the vacuum chamber when opening the valve in the return tube. The draining of the return tube 24 is done in the same manner as the draining of the feed tube 15 as described for the configuration with only a feed tube.

The invention claimed is:

1. A method to operate an apparatus for feeding liquid metal to an evaporator device in a vacuum chamber, wherein a feed tube runs from a container adapted to contain a liquid metal to the evaporator device and wherein an electromagnetic pump is provided in the feed tube and a valve in the feed tube between the electromagnetic pump and the evaporator device, wherein the method comprises:
   providing the electromagnetic pump which is at least partially gas permeable,
   enclosing the electromagnetic pump in a pressure controlled enclosure,
   lowering the pressure in the pressure controlled enclosure to obtain a vacuum and maintaining the vacuum in the pressure controlled enclosure before and/or when filling the electromagnetic pump with liquid metal,
   maintaining a vacuum in the pressure controlled enclosure during operation, and
   increasing the pressure to an increased pressure and maintaining the increased pressure in the pressure controlled enclosure before and/or when draining liquid metal from the electromagnetic pump.

2. The method according to claim 1, wherein the vacuum in the pressure controlled enclosure is a low vacuum in the range of 1-200 mbar.

3. The method according to claim 1, wherein the increased pressure in the pressure controlled enclosure is atmospheric pressure or higher.

4. The method according to claim 1, wherein the valve is closed preceding the filling and draining of the electromagnetic pump.

5. The method according to claim 1, wherein the pressure controlled enclosure encloses at least part of the feed tube.

6. The method according to claim 1, wherein the pressure controlled enclosure encloses at least a part of the feed tube that is located above the elecromagnetic pump, wherein the enclosed part of the feed tube that is located above the electromagnetic pump is at least partially gas permeable.

7. The method according to claim 1, wherein the electromagnetic pump is at least partially made of graphite.

8. The method according to claim 1, wherein at least the enclosed part of the feed tube is at least partially made of graphite.

9. The method according to claim 1, wherein the force on the liquid metal in the container adapted to contain a liquid metal is controlled.

10. The method according to claim 1, wherein a magnetic field for the electromagnetic pump is applied from outside the pressure controlled enclosure.

11. The method according to claim 1, wherein the container adapted to contain a liquid metal is a closed container and wherein the force on the liquid metal is controlled by controlling the pressure of the gas in the closed container.

12. The method according to claim 1, wherein a return tube, which runs from the evaporator device to the container, an electromagnetic pump, which is at least partially gas permeable, in the return tube and a valve in the return tube between the electromagnetic pump and the vacuum chamber is provided, wherein the electromagnetic pump in the return tube is provided in the pressure controlled enclosure, comprising the step of increasing the pressure and/or maintaining an increased pressure in the pressure controlled enclosure before and/or when draining liquid metal from the electromagnetic pump.

13. The method according to claim 1, wherein the method comprises:
   providing the electromagnetic pump which is at least partially gas permeable,
   enclosing the electromagnetic pump in the pressure controlled enclosure,
   lowering the pressure in the pressure controlled enclosure to obtain the vacuum and maintaining the vacuum in the pressure controlled enclosure before and/or when filling the electromagnetic pump with liquid metal,
   maintaining the vacuum in the pressure controlled enclosure during operation, and
   increasing the pressure to the increased pressure and maintaining the increased pressure in the pressure controlled enclosure before and when draining liquid metal from the electromagnetic pump.

14. The method according to claim 1, wherein the method comprises:
   providing the electromagnetic pump which is at least partially gas permeable,
   enclosing the electromagnetic pump in the pressure controlled enclosure,
   lowering the pressure in the pressure controlled enclosure to obtain the vacuum and maintaining the vacuum in the pressure controlled enclosure before and/or when filling the electromagnetic pump with liquid metal,
   maintaining the vacuum in the pressure controlled enclosure during operation, and
   increasing the pressure to the increased pressure and maintaining the increased pressure in the pressure controlled enclosure before or when draining liquid metal from the electromagnetic pump.

15. The method according to claim 1, wherein the method comprises:
   providing the electromagnetic pump which is at least partially gas permeable,
   enclosing the electromagnetic pump in the pressure controlled enclosure,
   lowering the pressure in the pressure controlled enclosure to obtain the vacuum and maintaining the vacuum in the pressure controlled enclosure before and when filling the electromagnetic pump with liquid metal,
   maintaining the vacuum in the pressure controlled enclosure during operation, and
   increasing the pressure to the increased pressure and maintaining an the increased pressure in the pressure controlled enclosure before and/or when draining liquid metal from the electromagnetic pump.

16. The method according to claim 1, wherein the method comprises:
   providing the electromagnetic pump which is at least partially gas permeable,
   enclosing the electromagnetic pump in the pressure controlled enclosure,
   lowering the pressure in the pressure controlled enclosure to obtain the vacuum and maintaining the vacuum in the pressure controlled enclosure before or when filling the electromagnetic pump with liquid metal,
   maintaining a vacuum in the pressure controlled enclosure during operation, and
   increasing the pressure and maintaining an increased pressure in the pressure controlled enclosure before and/or when draining liquid metal from the electromagnetic pump.

17. The method according to claim 1, wherein the method comprises:
   providing the electromagnetic pump which is at least partially gas permeable,
   enclosing the electromagnetic pump in the pressure controlled enclosure,
   lowering the pressure in the pressure controlled enclosure to obtain the vacuum and maintaining the vacuum in the pressure controlled enclosure before and when filling the electromagnetic pump with liquid metal,
   maintaining a vacuum in the pressure controlled enclosure during operation, and
   increasing the pressure to the increased pressure and maintaining the increased pressure in the pressure controlled enclosure before and when draining liquid metal from the electromagnetic pump.

* * * * *